United States Patent [19]
Baum

[11] Patent Number: 5,276,707
[45] Date of Patent: * Jan. 4, 1994

[54] METHOD FOR OPTIMIZING AN ADAPTIVE FILTER UPDATE COEFICIENT

[75] Inventor: Kevin L. Baum, Hoffman Estates, Ill.

[73] Assignee: Motorola, Inc., Schaumburg, Ill.

[*] Notice: The portion of the term of this patent subsequent to Jul. 20, 2000 has been disclaimed.

[21] Appl. No.: 40,064

[22] Filed: Mar. 30, 1993

Related U.S. Application Data

[63] Continuation of Ser. No. 772,825, Jun. 28, 1991, Pat. No. 5,230,000.

[51] Int. Cl.$^5$ .............................................. H03H 7/30
[52] U.S. Cl. .................................... 375/14; 364/724.2
[58] Field of Search ............... 375/14, 15; 364/724.19, 364/724.20; 333/28

[56] References Cited

U.S. PATENT DOCUMENTS 4,577,330  3/1986  Kavehrad ........................... 375/15
5,027,371  6/1991  Sehier et al. ......................... 375/15

Primary Examiner—Curtis Kuntz
Assistant Examiner—Tesfaldet Bocure
Attorney, Agent, or Firm—John J. King

[57] ABSTRACT

The method of the present invention generates an optimal adaptive filter update coefficient by first generating three error signals using a signal input and three update coefficients (301-303). Mean Square Error (MSE) values are estimated (307 and 308) for the first and third error signals. The first MSE value (307) is subtracted (309) from the third MSE value (308) to generate a difference signal. The difference signal is used to generate (310) an update signal that is used to modify the update coefficients. The process of the present invention is repeated until the difference signal is substantially zero, thus optimizing the second update coefficient. This process enables an update coefficient for an adaptive filter to quickly adapt to a changing environment.

1 Claim, 5 Drawing Sheets

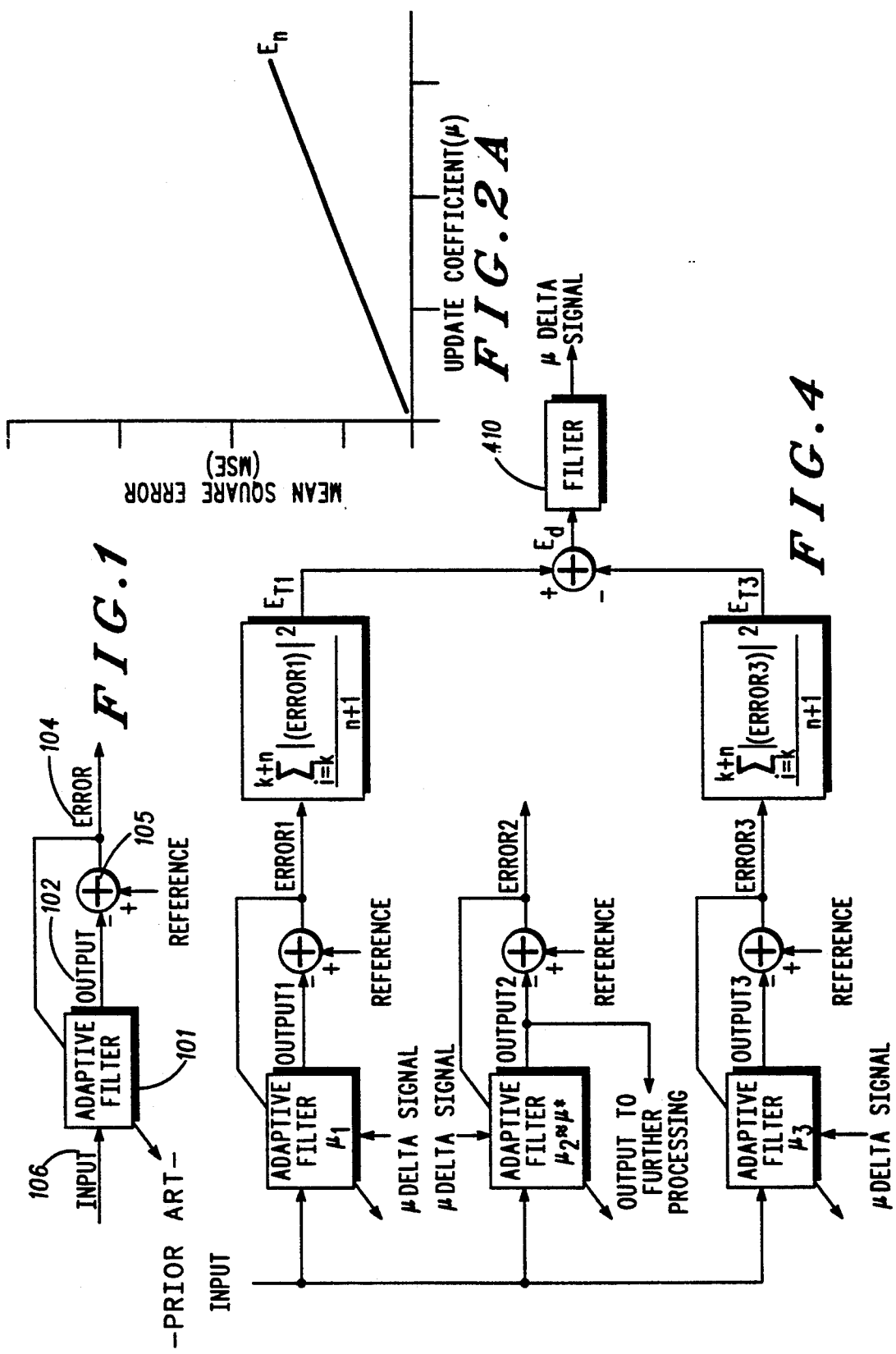

METHOD FOR OPTIMIZING AN ADAPTIVE FILTER UPDATE COEFICIENT

This is a continuation of copending application Ser. No. 07/772,825, filed on Jun. 28, 1991 now issued as U.S. Pat. No. 5,330,000.

FIELD OF THE INVENTION

The present invention relates generally to the field of communications and particularly to digital cellular communications.

BACKGROUND OF THE INVENTION

U.S. digital cellular communications uses digitized voice and data signals for communication between a mobile telephone and a base station. When the mobile moves, it may encounter degraded communication channels due to noise and multipath distortion; both noise and distortion varying with time. The multipath distortion is due to a signal being received by the mobile at different times when it bounces off buildings and terrain. Multipath channels can cause intersymbol interference (ISI) that can be removed with an adaptive equalizer, a specific type of an adaptive filter.

A typical adaptive filter is illustrated in FIG. 1. The input signal (106) is process by the adaptive filter (101), producing the adaptive filter output signal (102). The output of the filter is then subtracted (105) from a reference signal (103), to produce an error signal (104). This error signal (104) is used by an adaptive algorithm with an update coefficient, $\mu$, in the adaptive filter to update the filter coefficient or memory coefficient. It is assumed that the memory of the adaptive algorithm increases as the value of $\mu$ increases.

The update coefficient controls the memory of the adaptive algorithm and its determination is a trade-off between the rate that the filter can track the changing channel characteristics and the amount of noise averaging that will be accomplished by the adaptive algorithm. As the adaptive algorithm memory is shortened, the algorithm is better able to track time variations in the communication channel but will become more sensitive to noise on the communication channel. If the coefficient is chosen to filter out more noise, the filter's channel tracking capability will be reduced.

The adaptive algorithm can be a Kalman, Recursive Least Square, or Least Mean Square (LMS) algorithm. The typical goal of the adaptive algorithm is to minimize the means square value of the error signal (104). This value is typically designated means square error (MSE).

FIGS. 2A, B, and C illustrate the three possible classes of adaptive filter operating environments. FIG. 2A is a time invariant system in a noisy environment. In this case, the total MSE, designated $E_T$, comes only from the noise, designated $E_n$, since the system is not time varying. The total MSE is proportional to $\mu$.

FIG. 2B is a time varying but stationary system in a noisy environment; a stationary system having higher order signal statistics that do not change over time. In this example, $E_T$ (203) consists of the sum of two independent components, the lag error (201) and the noise (202). The lag error (201) is due to the filter attempting to track the time varying system. The lag error (201), designated $E_L$, is inversely proportional to $\mu$. The noise component (202) is due to the noisy environment as illustrated in FIG. 2A. It can be seen in FIG. 2B that the total MSE can be minimized by choosing the value of $\mu$ corresponding to the intersection of the curves (204).

The last environment is a time varying, non-stationary system in a noisy environment. The total MSE in this case consists of the same components as in FIG. 2B. The difference between the two systems is that in this case, the curves are shifting or changing slope over time causing the minimum point on the curve to shift thus changing the optimal value of $\mu$ over time. This environment is illustrated by comparing FIGS. 2B and 2C. FIG. 2B represents the MSE characteristic at some time $t_1$ while FIG. 2C represents the MSE characteristic at some later time $t_2$.

A fixed update coefficient in the last environment would not provide adequate filter performance due to the changing environment. There is a resulting need for automatically adapting the update coefficient according to the vehicle speed and channel conditions thereby improving filter performance.

SUMMARY OF THE INVENTION

The method of the present invention produces an optimum adaptive filter update coefficient in an apparatus having a plurality of adaptive algorithms, each adaptive algorithm having an update coefficient. The method starts by comparing performances of each of the plurality of adaptive algorithms then modifying the update coefficients in response to a difference in the performances.

BRIEF DESCRIPTION OF THE DRAWINGS

FIG. 1 shows a block diagram of a typical adaptive filter.

FIG. 4 shows a block diagram of an alternate embodiment of the process of the present invention.

DETAILED DESCRIPTION OF THE PREFERRED EMBODIMENT

The process of the present invention provides automatic adjustment and optimization of an adaptive filter update coefficient in a changing environment. The update coefficient is continuously updated by a feedback signal that is generated by the filtered difference between MSE estimates for two adaptive filters.

Figure 3:
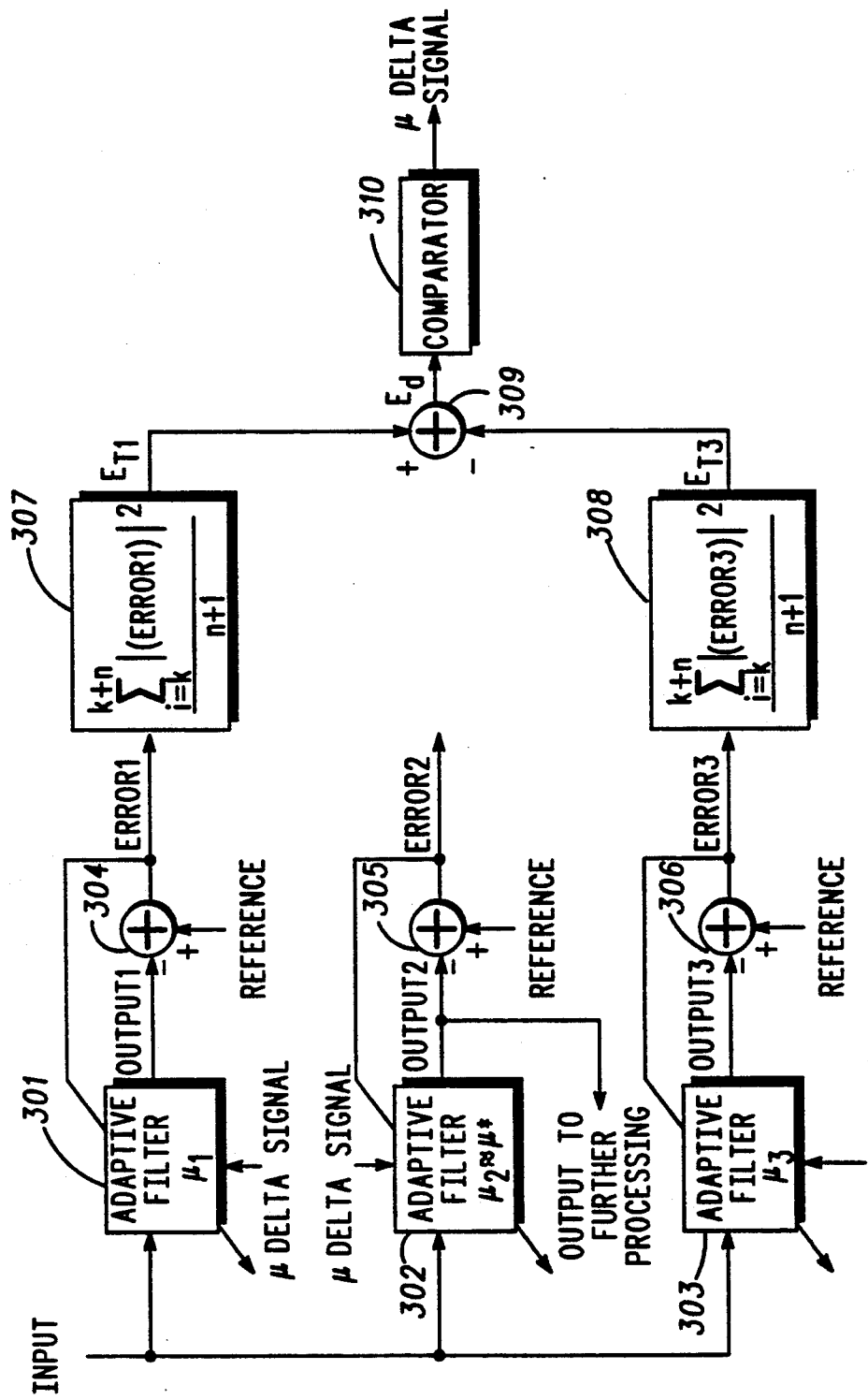
FIG. 3 shows a block diagram of the preferred embodiment of the process of the present invention.

A block diagram of the preferred embodiment of the process of the present invention is illustrated in FIG. 3. The process is comprised of three adaptive filters (301–303). Each of the filters is identical except for having different update coefficients, $\mu_1$, $\mu_2$, and $\mu_3$. The second update coefficient, $\mu_2$, is the coefficient that is optimized by the process. The optimal update coefficient is subsequently referred to as $\mu^*$. Since $\mu_2$ is the optimized update coefficient, the second adaptive filter (302) is the filter used to perform the actual desired adaptive filtering function.

The update coefficients have the following relationship:

$$\mu_1 < \mu_2 < \mu_3$$

$$\mu_1 = \mu_2 - \mu_d$$

$$\mu_3 = \mu_2 + \mu_d,$$

where $\mu_d$ is a constant chosen for the particular system in which the communication device is to operate as well as the particular adaptive algorithm used. In an alternate embodiment, $\mu_d$ would vary with time as the update coefficients change. In the preferred embodiment, $\mu_d$ is 0.01 using an LMS adaptive algorithm.

The process first generates error signals from the adaptive filters (301-303). This is accomplished by the adaptive filters (301-303) filtering the input signal in such a way that it forms a signal that matches the reference signal as close as possible. In the preferred embodiment, the input is the detected symbols in the communication receiver. These output signals are referred to as OUTPUT1, OUTPUT2, and OUTPUT3 in FIG. 3. Each output signal from the filters is then subtracted (304-306) from a reference signal. In the preferred embodiment, the reference signal is the received signal. The difference between these two signals is the error signal.

Means square error estimates are performed (307 and 308) on the error signals from the first and third adaptive filters (301 and 303). The MSE for each error signal is estimated as follows:

$$E_{T1} = \frac{\sum_{i=k}^{k+n} |\text{error1}|^2}{n + 1}$$

$$E_{T3} = \frac{\sum_{i=k}^{k+n} |\text{error3}|^2}{n + 1}$$

where k is the start value and n is the number of samples of the error signal. For example, if k=1 and n=10 for the first estimation cycle, k will start at 12 for the next cycle.

The difference between the estimated MSE's (309) $E_d = E_{T1} - E_{T3}$, provides an indication of which direction to move along the $\mu$ axis to get closer to $\mu^*$. In the preferred embodiment, $E_d$ is input to a comparator (310) where it is compared to 0. If $E_d < 0$, then $\mu_1$ is closer to $\mu^*$ than $\mu_3$. The coefficients, therefore, should be decremented in order to move $\mu_2$ closer to $\mu^*$. In this case, the coefficient updates are illustrated as follows:

if $E_d < 0$ then:

$$\mu_1 = \mu_1 - \Delta$$

$$\mu_2 = \mu_2 - \Delta$$

$$\mu_3 = \mu_3 - \Delta$$

otherwise, if $E_d > 0$ then the coefficients should be incremented:

$$\mu_1 = \mu_1 + \Delta$$

$$\mu_2 = \mu_2 + \Delta$$

$$\mu_3 = \mu_3 + \Delta,$$

where $\Delta$ is the update coefficient step size. This value is application dependent. $\Delta$ can be chosen as a very small value for time invariant and stationary environments and slightly larger for non-stationary environments. This value determines the resolution of the update coefficients. In a preferred embodiment, $\Delta$ is 0.005 using an LMS adaptive algorithm. As with $\mu_d$, in an alternate embodiment, $\Delta$ could vary with time.

In an alternate embodiment, illustrated in FIG. 4, $E_d$ is input to a filter (410) instead of a comparator. The filter provides a time varying step size (compared to the fixed step size $\Delta$) that is responsive to the size of the error difference signal. For example, when the error difference signal becomes large, the step size automatically increases resulting in faster convergence of the algorithm. Using the filter, however, increases the complexity of the invention and may cause stability problems if a higher order filter is used. A first order digital infinite impulse response (IIR) filter is preferred due to stability and simplicity considerations. In this case, the update coefficients are adapted by adding the value of the output of the filter to the coefficients.

After several adaptation iterations, $\mu_1$ is slightly smaller than $\mu^*$, $\mu_3$ is slightly larger than $\mu^*$, $\mu_2$ is approximately equal to $\mu^*$, and the error difference signal is approximately zero. Adaptive filter 2 (302) is not optimized for the current environment. If the environment changes, the process of the present invention detects and tracks the change to maintain the optimality of adaptive filter 2 (302).

Figure 2B:
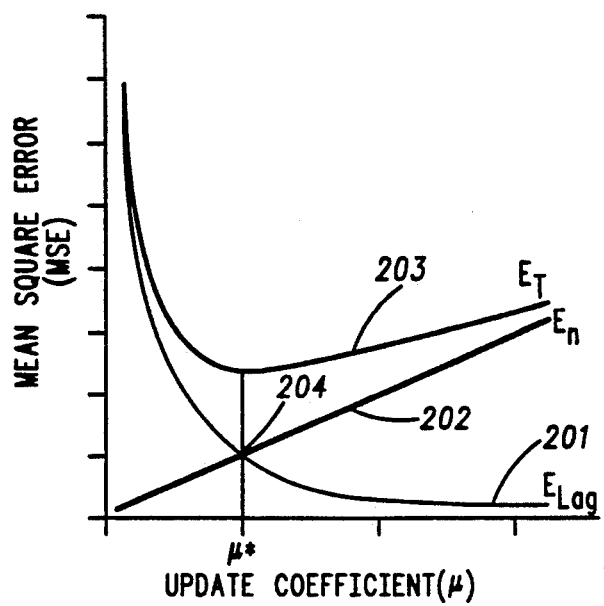
FIGS. 2A, B, and C show three different adaptive filter operating environments.
Figure 2C:
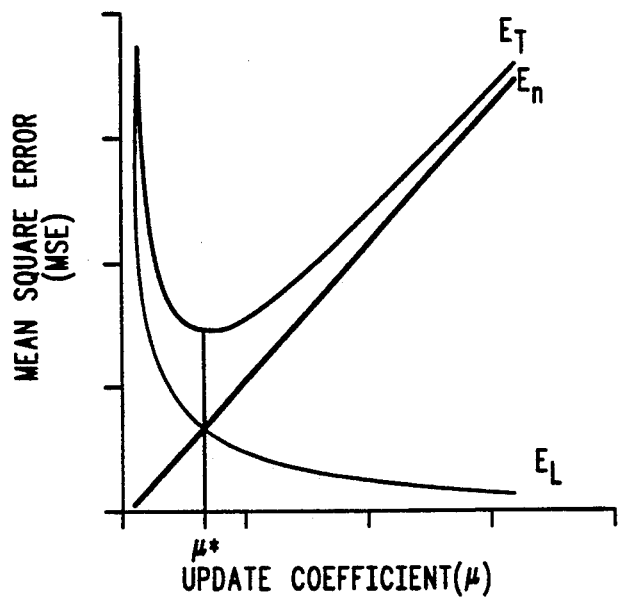
Figure 5:
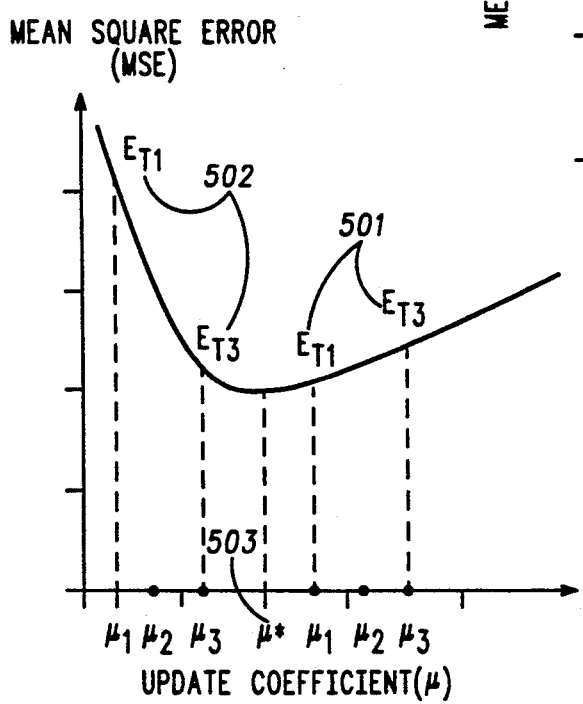
FIG. 5 shows a graph of MSE versus $\mu$ in accordance with the process of the present invention.

The above described process can be illustrated graphically as seen in FIG. 5, a plot of MSE versus $\mu$. In the case where $E_d < 0$, $E_{T1}$ and $E_{T3}$ (501) are on the right part of the curve and must move down the curve to the left in order to locate $\mu_2$ at the bottom of the curve which is the optimum point. This requires decrementing the update coefficients by $\Delta$ to move $\mu_2$ closer to the $\mu^*$ point. Similarly, if $E_d > 0$, $E_{T1}$ and $E_{T3}$ (502) are on the left part of the curve and must move down the curve to the right to locate $\mu_2$ at the optimum point. This requires incrementing update coefficients by $\Delta$ to move $\mu_2$ closer to the $\mu^*$ point (503).

Figure 6:
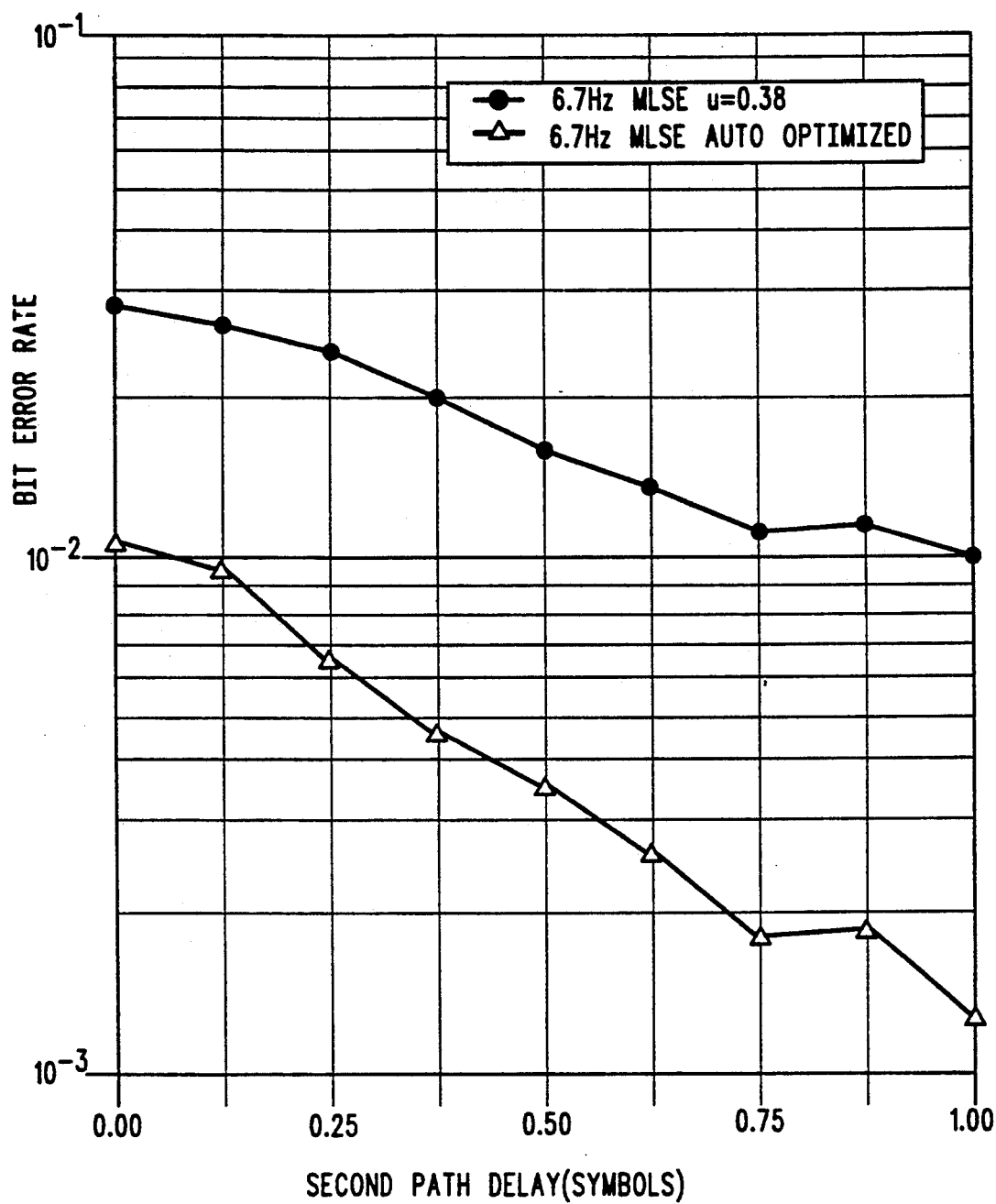
FIG. 6 shows a plot of a fixed update coefficient and an optimized update coefficient in accordance with the process of the present invention.
Figure 7:
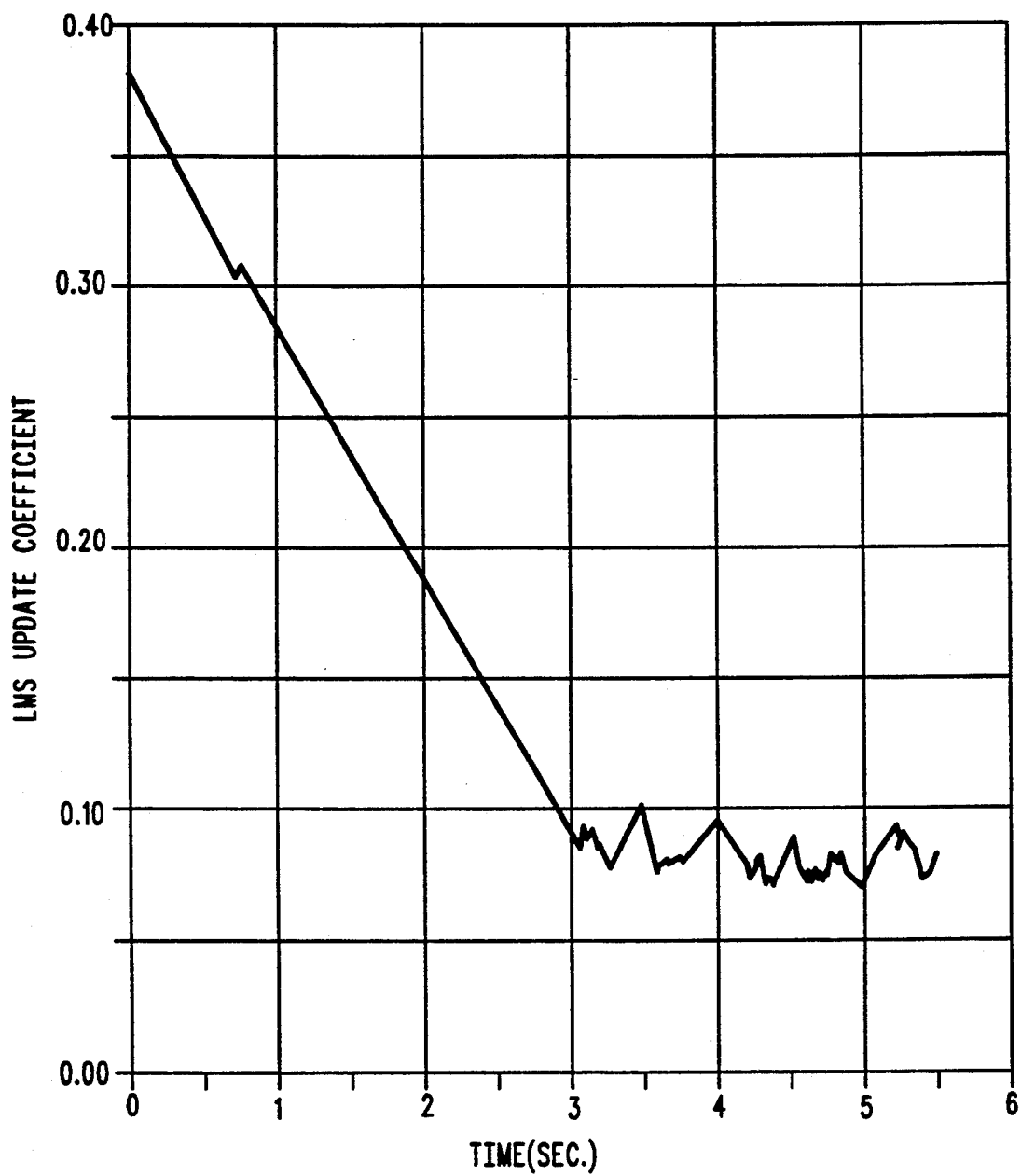
FIG. 7 shows a plot of an update coefficient, in accordance with the process of the present invention, in a delay spread environment.

The improvement using the process of the present invention over a fixed update coefficient is illustrated in FIGS. 6 and 7. In these graphs, the process is used with a least means square (LMS) adaptive channel estimator in simulations of a Maximum Likelihood Sequence Estimation equalizer for the U.S. digital cellular system. The fixed update coefficient is set at $\mu = 0.38$ to allow adequate performance when the mobile radiotelephone is traveling in vehicle at high speeds. By using the process of the present invention, the performance of the equalizer is improved at significantly lower vehicle speeds, as illustrated in FIG. 6. FIG. 6 shows the performance of the equalizer as a function of multipath delay and the vehicle speed is approximately 5 mph. FIG. 7 shows how the process operates in a channel with delay spread and co-channel interference when the vehicle speed drops instantaneously from 63 mph to 5 mph. It can be seen that the update coefficient quickly decreases to a new lower level suitable for the lower vehicle speed.

In the preferred embodiment, the process of the present invention is implemented as an algorithm. Alternate embodiments of the invention can be implemented in hardware or combinations of hardware and software;

each block of the process being either an algorithm or a hardware circuit equivalent of that block.

In summary, a process of automatically optimizing an adaptive filter update coefficient in a changing environment has been described. By comparing the performance of each adaptive algorithm to determine how to change the update coefficients, an optimal update coefficient for that particular environment can be obtained. Communication devices using the process of the present invention can out-perform devices using a fixed update coefficient.

I claim:

1. A method for generating an optimum memory coefficient in an apparatus having two adaptive filters, each adaptive filter having an input signal and a reference signal, a first adaptive filter of the two adaptive filters having a first memory coefficient and a second adaptive filter of the two adaptive filters having a second memory coefficient, the method comprising the steps of:

generating an error signal for each adaptive filter in response to the input signal and the reference signal.

averaging each error signal to generate an average error for each adaptive filter.

comparing the average error of the two adaptive filters; and modifying the first and second memory coefficients in response to a difference in the average errors.

* * * * *

UNITED STATES PATENT AND TRADEMARK OFFICE
CERTIFICATE OF CORRECTION

PATENT NO. : 5,276,707
DATED : January 4, 1994
INVENTOR(S) : Kevin L. Baum

It is certified that error appears in the above-indentified patent and that said Letters Patent is hereby corrected as shown below:

Title Page, item [54] and col. 1, line 2,
Title page, under Notice, change the year "2000" to --2010--.

Title page, under Related U.S., Application Data, change the Patent No. "5,230,000" to --Continuation of Serial No. 07/722,825, June 28, 1991, Pat. No. 5,320,007--.

Signed and Sealed this

First Day of November, 1994

Attest:

BRUCE LEHMAN

*Attesting Officer*   *Commissioner of Patents and Trademarks*